United States Patent [19]

Imken et al.

[11] Patent Number: 5,198,693
[45] Date of Patent: Mar. 30, 1993

[54] APERTURE FORMATION IN ALUMINUM CIRCUIT CARD FOR ENHANCED THERMAL DISSIPATION

[75] Inventors: Ronald L. Imken, Round Rock; Joseph LaTorre, Austin, both of Tex.

[73] Assignee: International Business Machines Corporation, Armonk, N.Y.

[21] Appl. No.: 831,855

[22] Filed: Feb. 5, 1992

[51] Int. Cl.$^5$ .................. H01L 23/34; H01L 23/36
[52] U.S. Cl. .................. 257/720; 257/707; 257/679; 257/723
[58] Field of Search .................. 357/81, 80, 74, 72; 257/707, 720, 679, 723, 724; 361/387, 395

[56] References Cited

U.S. PATENT DOCUMENTS

| | | | |
|---|---|---|---|
| 4,261,792 | 4/1981 | Tsuji et al. | 156/656 |
| 4,564,584 | 1/1986 | Fredericks et al. | 430/312 |
| 4,589,961 | 5/1986 | Gershenson | 204/15 |
| 4,774,633 | 9/1988 | Dehaine et al. | 357/80 |
| 4,894,126 | 1/1990 | Mahmoud | 204/58 |
| 4,898,651 | 2/1990 | Mahmoud | 204/29 |
| 4,962,415 | 10/1990 | Yamamoto et al. | 357/74 |
| 5,099,309 | 3/1992 | Kryzaniwsky | 357/81 |

OTHER PUBLICATIONS

IBM TDB "Sealing Technique for Porous Anodic Al$_2$O$_3$ Fimls", vol. 14, No. 10, Mar. 1972, p. 2898.
IBM TDB "Anodization Process for Planarization of Aluminum-Copper-Silicon Metallurgy", vol. 16, No. 3, Aug. 1973, p. 1010.
IBM TDB "Process for Noble Metal Pattern Generation", vol. 16, No. 7, Dec. 1973, p. 2157.
IBM TDB "Monolithic Studs for Interlevel Connectors", vol. 17, No. 6, Nov. 1974, pp. 1605-1606.
IBM TDB "Aluminum-Aluminum Oxide Gas Panel", vol. 26, No. 6, Nov. 1983, p. 2798.
Research Disclosure "Screened Polymer Thick Film Resistors and Metallization on Thick Anodic Coatings", Sep. 1985, p. 257.
IBM TDB "Sealing Cracks in Anodized Aluminum with Electrodeposited Organic Material for Dielectric Protection", vol. 32, No. 12, May 1990, p. 148.

*Primary Examiner*—William Mintel
*Assistant Examiner*—S. V. Clark
*Attorney, Agent, or Firm*—Mark E. McBurney

[57] ABSTRACT

A method and system are provided for forming apertures in the dielectric layers of an aluminum circuit to allow electrical connection to the aluminum core and enhance the thermal efficiency of integrated circuit devices attached thereto. Specifically, the apertures are formed to accommodate the ICs and allow them to be in direct contact with the aluminum core layer of the circuit card. The apertures are formed by placing a photoresist material on the aluminum core in locations corresponding to the desired locations of the aperture. The photoresist material is used as a "placeholder" during subsequent processing. The aluminum is then anodized to form aluminum oxide and a polymer material is then electrophoretically placed over the aluminum oxide. The photoresist "placeholder" is then removed, leaving an aperture that will accommodate an IC. The top of the polymer layer can then be circuitized to interconnect the chips.

6 Claims, 4 Drawing Sheets

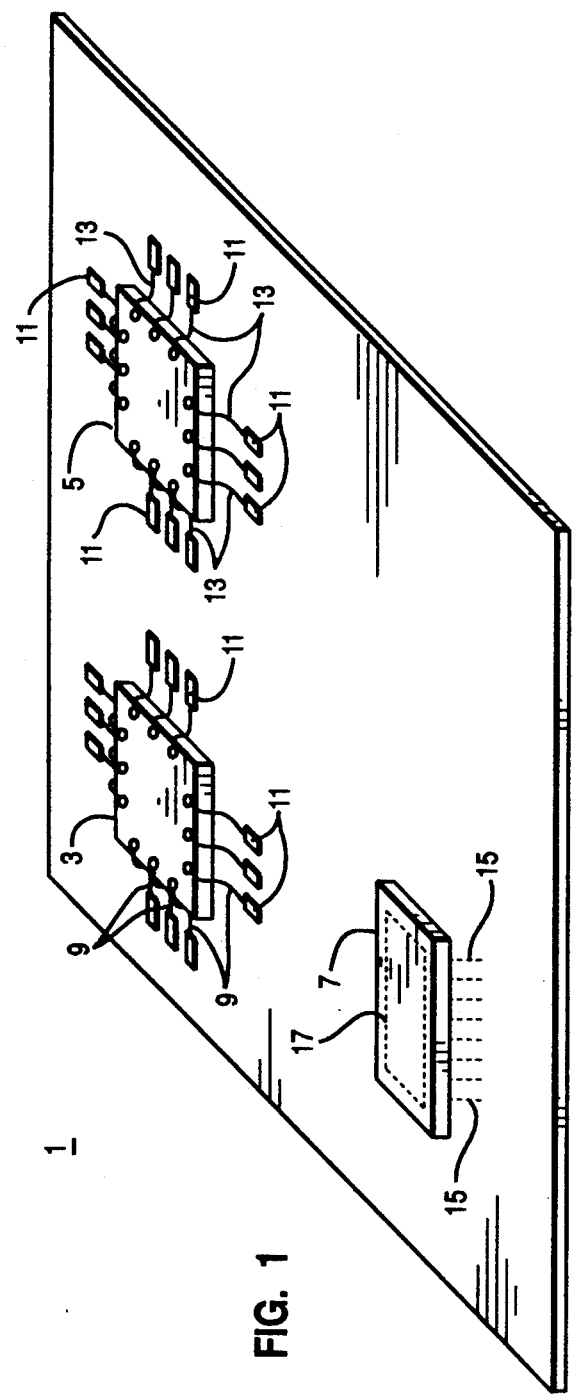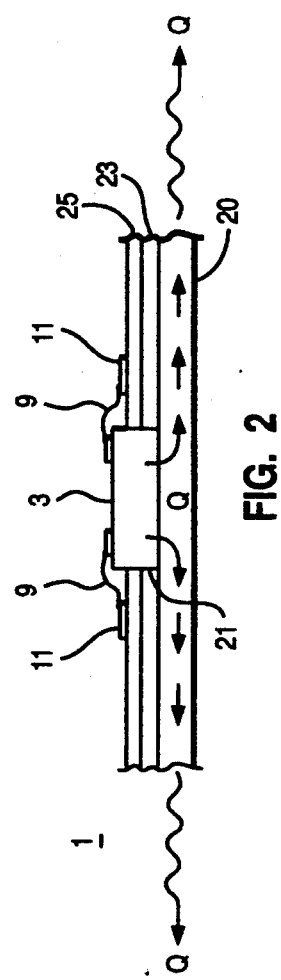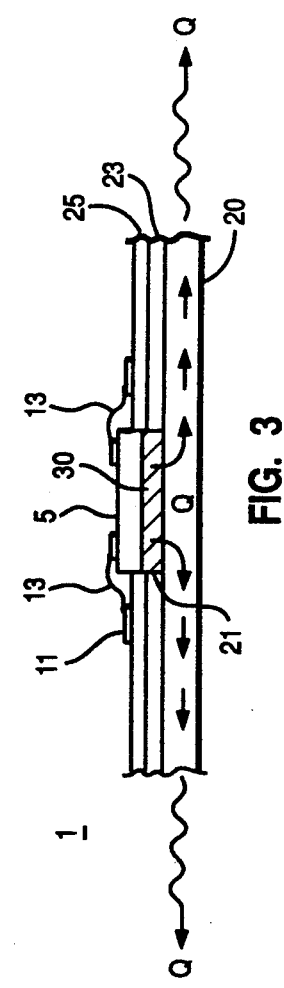

APERTURE FORMATION IN ALUMINUM CIRCUIT CARD FOR ENHANCED THERMAL DISSIPATION

BACKGROUND OF THE INVENTION

1. Field of the Invention

The present invention relates generally to a method of forming an aperture in the dielectric coating of an aluminum circuit card that will allow utilization of the aluminum core to more efficiently dissipate heat generated by an electronic component, such as an integrated circuit device attached thereto. More specifically, the aperture is formed in the aluminum circuit card which allows the integrated circuit device to directly abut the aluminum core, thereby using the core to aid in heat dissipation. The aperture may also be used to provide an electrical contact to the aluminum core of the circuit card.

2. Description of Related Art

It is currently known to use aluminum as a potential reference conductive layer within circuit cards. Typically, an aluminum layer is anodized to form aluminum oxide and then electrophoretically (EP) coated with a polymer material to provide an insulating dielectric layer. Generally, integrated circuit (IC) packages, such as dual-in-line packages (DIP), wire bonded ICs. and surface mount components (SMT) are electrically attached to a wiring layer on the EP polymer layer. These attached chips are then interconnected by the wiring layer also placed on the EP material.

It was noted that a portion of the heat generated by the IC devices was being dissipated through the aluminum core layer but only after the heat was transmitted through the EP polymer and anodized aluminum layer. In this case, the heat was transferred through the entire thickness of both the EP and aluminum oxide layers prior to being dissipated through the aluminum core layer. Thus it can be seen that improvements in thermal efficiency will occur if the integrated circuit devices could be placed in direct contact with the aluminum core. That is, forming an aperture within the aluminum oxide and EP layers having the dimensions of a chip being attached to the card would allow electrical connections to be made between the chip and the wiring on the EP polymer layer while at the same time maintaining direct physical contact with the aluminum core.

U.S. Pat. No. 4,261,792 describes forming an anodized layer over the entire surface of a wafer, etching the anodized layer through a photoresist mask to form an anodized mask layer, and then etching the underlying material using the anodized layer as a mask. U.S. Pat. No. 4,589,961 discusses an improvement to the selective non-anodizing process for fabricating Josephson junction devices by using aluminum oxide as a protective layer. IBM Technical Disclosure Bulletin. "Process For Noble Metal Pattern Generation," discusses a method of generating a noble metal pattern by using a thick anodized aluminum oxide film generating a negative pattern on the oxide using a photoresist step and depositing the desired metal over the entire surface, which includes etching the aluminum oxide. IBM Technical Disclosure Bulletin, "Aluminum-Aluminum Oxide Gas Panel describes fabricating a gas panel using aluminum conductors wherein aluminum is deposited on the gas panel substrate glass. A photoresist conductor pattern is applied and the panel is anodized such that the unprotected aluminum is oxidized and the portion of the aluminum covered by the photoresist remains unoxidized and forms the aluminum conductors. IBM Technical Disclosure Bulletin "Anodization Process for Planarization of Aluminum-Copper-Silicon Metallurgy." is a method for forming conductive pathways of IC interconnections and electrically insulating the pathways by depositing aluminum which is then selectively converted in aluminum oxide, which is a dielectric material. IBM Technical Disclosure Bulletin "Sealing Cracks in Anodized Aluminum with Electrodeposited Organic Material for Dielectric Protection" discusses a technique for placing the EP polymer layer over the anodized aluminum layer of the circuit board. Further U.S. Pat. Nos. 4,898,651 and 4,894,126 describe methods used to anodize the aluminum core layer of a circuit card.

Therefore, it would be desirable to have an aluminum circuit card that will efficiently dissipate the heat generated by integrated circuit devices attached thereto. This is especially important since chips are constantly being developed having a greater number of circuits which generate correspondingly more heat that must be dissipated. Further, a process of forming apertures in the electrically insulating dielectric layers of the aluminum circuit card to allow direct attachment of the chips to the aluminum core would be advantageous.

SUMMARY OF THE INVENTION

In contrast to the prior art, the present invention provides an efficient method of forming apertures in the dielectric layers of an aluminum circuit card to accommodate the ICs and allow them to be in direct physical contact with the aluminum core layer of the circuit card, and also provide an electrical contact point to the aluminum core for circuitry or electronic devices. More particularly, the present invention forms these apertures by placing a layer of photoresist material on the aluminum core (usually the reference plane). Subsequently, a mask is placed over the photoresist material and exposed such that a portion of the photoresist material, having dimensions corresponding to the desired IC. or electrical contact point is cured. The remaining photoresist material is then removed, leaving the cured material as a "placeholder". Next, the exposed surface of the aluminum is anodized to form aluminum oxide and a polymer material is then electrophoretically deposited over the surface of the aluminum oxide. The photoresist "placeholder" is then removed, leaving an aperture that will accommodate an IC, or provide an electrical contact point to the aluminum core. The top of the polymer layer can then be circuitized to interconnect the chips. Thus, it can be seen how the present invention provides a method and structure that allows heat to be efficiently dissipated through the aluminum core of an aluminum circuit card. Additionally, the aperture forming process can be utilized to maintain an exposed portion of the aluminum core as an electrical connection point to the reference plane.

Therefore, in accordance with the previous summary, objects, features and advantages of the present invention will become apparent to one skilled in the art from the subsequent description and the appended claims taken in conjunction with the accompanying drawings.

BRIEF DESCRIPTION OF THE DRAWINGS

FIG. 1 is a a perspective view of a circuit card having a plurality of differently configured ICs thereon:

FIG. 2 is a crossectional view of the circuit card showing how a wire bond type chip can be placed in the aperture of the present invention;

FIG. 3 is a crossectional view wherein a surface mount component is being utilized in the circuit card;

DETAILED DESCRIPTION OF THE PREFERRED EMBODIMENTS

Figure 4:
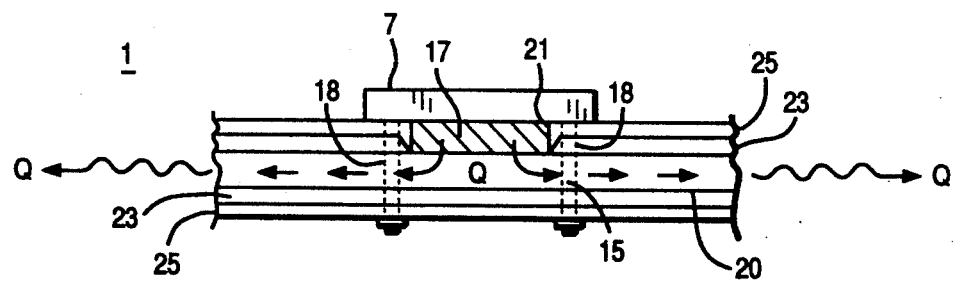
FIG. 4 is a crossection similar to FIGS. 2 and 3 with dual-in-line package in the circuit card.

Referring to FIG. 1, an aluminum circuit card is shown and generally noted by reference numeral 1. Integrated circuit devices 3, 5 and 7 are also shown and affixed to aluminum circuit card 1. Integrated circuit 3 may be of a type that is wire bonded to circuit card 1 and includes connecting wires 9 which are attached to pads 11 on the surface of aluminum circuit card 1. Pads 11 are formed on the outermost dielectric layer of aluminum circuit card 1 and connected to circuitized lines (not shown) also formed on circuit card 1. Integrated circuit device 5 is shown and may be a surface mount type component which includes leads 13 that interconnect chip 5 with pads 11 as previously discussed. A dual-in-line package (DIP) is shown by reference numeral 7 and includes leads 15 which extend through circuit card 1 and may interconnect with the aluminum core plane. A through hole, or via 18 (FIG. 4) may also be electrically isolated from the aluminum core plane, by the anodized and EP layers, from aluminum core 20. A heat sink 17 is shown underneath chip 7 and is utilized to more efficiently transfer generated heat from chip 7 and will be discussed in more detail below.

FIG. 2 is a crossectional view of a wire bonded type of component fixed to circuit card 1 using the aperture method of the present invention. Circuit card 1 includes an aluminum core layer 20 which not only provides an electrical reference plane but is also capable of transferring generated thermal energy away from the integrated circuit devices. An anodized aluminum layer 23, of aluminum oxide, is formed from the aluminum core 20 and a polymer dielectric material 25 is then electrophoretically placed on top of the aluminum oxide layer 23. Aperture 21 is created by utilizing a photoresist "placeholder" during the anodization and electrophoretic coating steps. In this manner layers 23 and 25 are built around the photoresist placeholder which when removed creates aperture 21. It can be seen that wire bond chip 3 is then placed into aperture 21 in direct contact with aluminum core 20, thereby enhancing the dissipation of generated thermal energy. Of course, a thermally conductive bonding material, such as an adhesive. solder, or the like may also be used to bond the chip to the aluminum core. Connections between chip 3 are then made using wire bonding techniques to pads 11, that are formed on the top surface of polymer layer 25. Thus, it can be seen how a wire bond type chip can utilize the aperture of the present invention to enhance heat dissipation, since chip 3 is in more intimate thermal contact with aluminum core 20.

FIG. 3 illustrates a surface mount type integrated circuit device included within aperture 21. Generally, surface mount type components lie in direct contact with the surface to which they are electrically connected. However, it is known in the art, to attach a thermal dissipation device such as a heat sink 30 to the underside of surface mount components. Therefore, it can be seen that heat sink 30 can be placed in aperture 21 and adjacent to core 20. An an interposed heat transfer media. e.g. thermal grease, or adhesive, may also be used between core 20 and heat sink 30 to provide more direct contact and enhance the thermal characteristics of the surface mount type components by thermally contacting core 20.

Similarly. FIG. 4 shows a dual-in-line package type component 7 attached to aluminum circuit card 1. Package 7 includes leads 15 which extend through vias 18 in circuit card 1. In this manner electrical connection can be made between chip 7 and core 20, which may be a signal or reference plane. As noted above, many of the leads 15 will be electrically isolated from core 20 by forming layers of anodized dielectric and EP coating around the annulus of via 18. DIP applications also require an additional layer of anodized aluminum 23 and EP layer 25 on the underside of the aluminum circuit card in order for the electrically isolated pins 15 to be connected with wiring formed on the underside EP layer. It should be noted that both sides of aluminum core 20 will also normally be anodized for wire bonding and SMT applications. in order to eliminate the need for a protective layer on the underside of core 20, and to prevent stress from being placed on the circuit card when aluminum is anodized to form aluminum oxide. Additionally, in FIG. 4. heat sink 17 is shown connected to the underside of chip 7 and contained within aperture 21, in the same manner as previously described with regard to SMT devices (FIG. 3). i.e. a heat spreader 17 contacts both the IC device and core 20 with an optional thermally conductive material therebetween. Thus heat sink 17 transfers the generated thermal energy from chip 7 to aluminum core 20 to aid in the dissipation thereof. It can be seen how an aperture formed within the aluminum circuit card will allow various types of integrated circuit component packages, or their associated heat sink devices to be placed in aperture 21 to directly contact the aluminum core 20 and provide an enhanced thermally conductive path.

Figure 5:
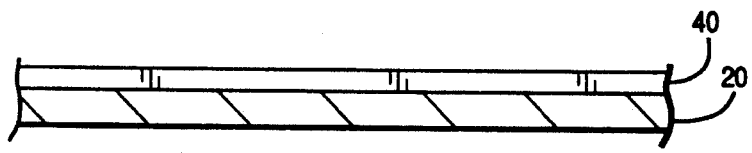
FIG. 5 show the aluminum core layer of the circuit card and a photoresist layer on the top side thereof.
Figure 6:
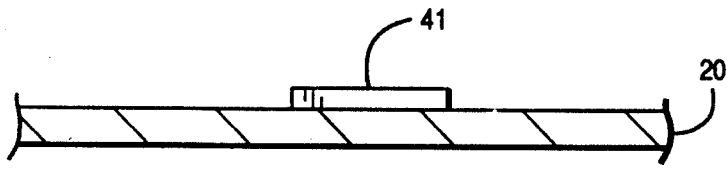
FIG. 6 illustrates the "placeholder" cured photoresist material after the remaining material has been removed.

The process of forming aperture 21 within an aluminum circuit card will now be described beginning with reference to FIG. 5. An aluminum core layer 20 is coated with a photoresist dielectric 40. Photoresist dielectric layer 40 can be applied using a number of known techniques including hot roll lamination, roller coating, curtain coating, screening, or the like. A mask (not shown) is then placed over the photoresist layer 40. It should be noted that the photo mask may be either negative or positive acting depending on the type of photoresist material 40 being utilized. In one example, material 40 is exposed to actinic radiation through the photo mask in order to induce chemical reaction and insolubility in that portion of layer 40 receiving the radiation. The unexposed portion of layer 40 is then removed by washing, or the like. FIG. 6 then shows the photoresist placeholder 41 that remains after removal of the uncured photoresist to form aperture 21 during subsequent processing of core 20 to form aluminum card 1. It should be noted that placeholder 41 will have dimensions corresponding to the desired dimensions of aperture 21. Of course aperture 21 must be sized for an electrical contact point, or to accommodate the various type of integrated circuit devices (DIP, SMT, wire bond bare chips) to be placed therein. Those skilled in the art will understand that the photomask is utilized to regulate the size of placeholder 41. Additionally, it should be noted that a nonphotoresistive material placeholder can be utilized to prevent anodization of the aluminum core 20 at the location desired for formation of aperture 21, e.g. any material that is resistive to the anodizing process. However a preferred embodiment of the present invention uses a photoresist material in order to optimize the dimensions of aperture 21.

Figure 7:
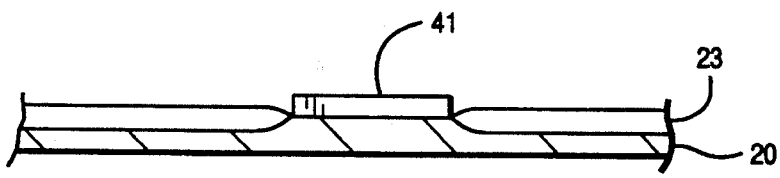
FIG. 7 is a side view of circuit card subsequent to the step of anodizing the aluminum core layer to form aluminum oxide.
Figure 8:
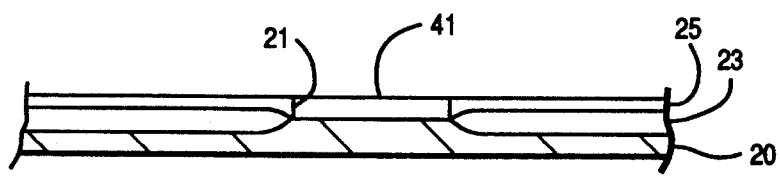
FIG. 8 shows the electrophoretically placed polymer material on the surface of the aluminum oxide.

In FIG. 7, aluminum core 20 has been anodized by placing core 20 and photoresist placeholder 41 in a sulfuric acid, or the like, based anodizing solution. The photoresist 41 is retained on core 20 during the anodization process. It should be noted that during the anodization process an approximately 2 mil thickness of aluminum core 20 will be transformed into a 3 mil thickness of anodized aluminum, i.e. aluminum oxide. Thus, the anodization process decreases the thickness of aluminum core 20 while forming the anodized layer 23. In FIG. 8, polymer layer 25 is placed on aluminum oxide layer 23 by electrophoretic coating with a melamine-acrylic solution, or the like, and subsequently cured. Thus, alumimum oxide and polymer layers 23 and 25, respectively, are formed which serve as an electrically insulating dielectric material for aluminum core 20.

Figure 9:
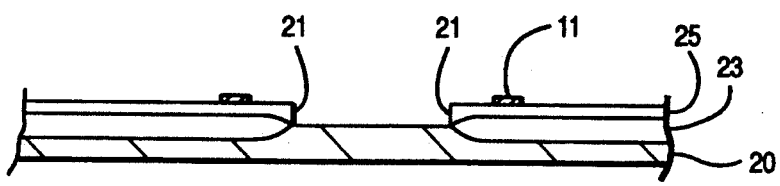
FIG. 9 illustrates a crossectional view of the circuit card of the present invention after the cured photoresist material has been removed and the top of the polymer layer has been circuitized.
Figure 12:
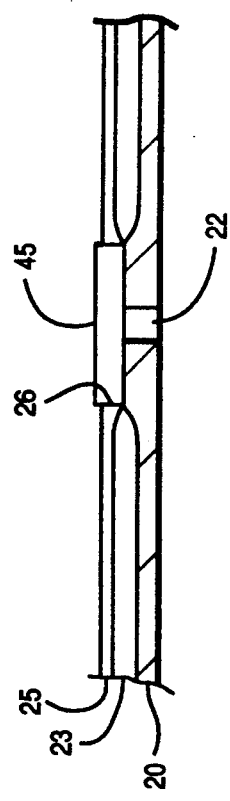
FIG. 12 is a crossectional view of another embodiment of the present invention wherein an alignment hole is protected by the photoresist placeholder.

FIG. 9 shows aperture 21 after the photoresist placeholder 41 has been removed. Photoresist 41 is stripped from core 20 by immersion of the board assembly in a suitable solvent such as acetone, 4-butyrolactone, or the like. Removal may be enhanced by mechanical brushing, spraying, or ultrasonic agitation. Therefore, it can be seen that aperture 21 can be formed in an aluminum circuit card such that a portion of aluminum card 20 is exposed in order to enhance the heat dissipation properties of attached integrated circuit devices. It will be understood that as many placeholders will be used as necessary to form the required number of apertures. A single placeholder 41 and aperture 21 has been shown as an example of the process of the present invention and should not be construed as a limitation. Additionally, referring to FIG. 9, pads 11 are shown on the top side of polymer layer 25. These pads and associated circuitized lines (FIG. 10) are placed on polymer layer 25 by conventional means such as plating screening (described in conjunction with FIG. 10) or the like. It should be noted that a photoresist placeholder 41 can be used for purposes other than creating an aperture that allows chips to be placed therein. For example, alignment holes are often placed by drilling or the like into the aluminum circuit card assembly and used for subsequent registration of the card in component placement machines. A photoresist material 41 can be placed over any alignment holes during the anodization and electrophoretic coating processes in order to maintain the dimensions of the alignment holes. The photoresist material then can be removed such that the size of the originally drilled hole is not impacted. Additionally, a photoresist material can be used to ensure exposure of the aluminum core during the anodization and subsequent electrophoretic coating steps when the exposed aluminum core is to be utilized for an electrical connection, e.g. when core 20 is used a reference plane. The processes previously described with regard to FIGS. 5-9 will apply equally as well when the photoresist material 41 is being used to ensure exposure of an alignment hole, or exposure of core 20 for electrical connection purposes. For example, referring to FIG. 12 aluminum core 20 is shown with alignment hole 22 disposed therein. Aluminum oxide anodized layer 23 and polymer layer 25 are also shown and surround aperture 21 which is maintained due to the presence of photoresist material 45. Upon removal of the photoresist material 45 it can be seen that hole 22 will be exposed with its original dimensions maintained. In this manner, the alignment hole 22 has been maintained during subsequent anodizing and electrophoretic coating procedures.

Figure 10:
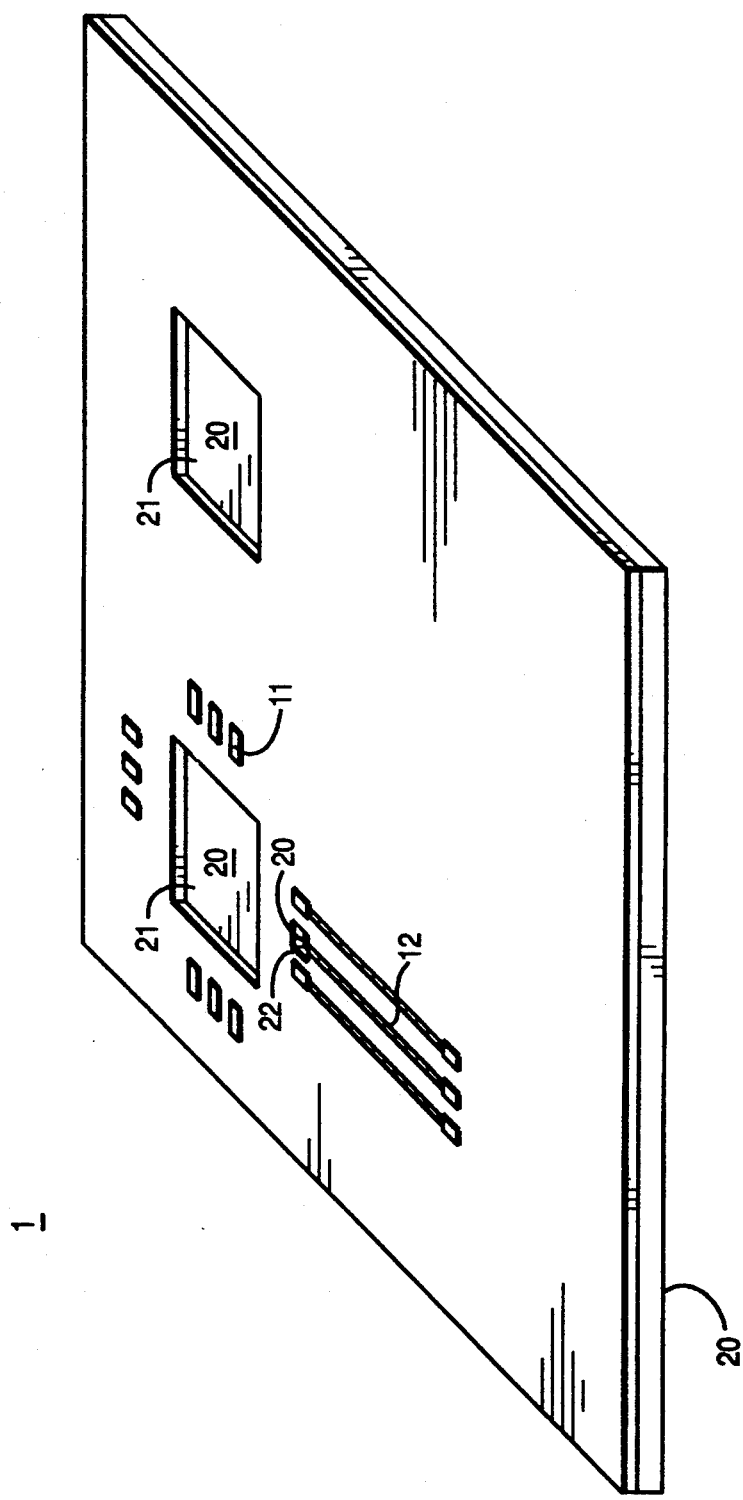
FIG. 10 is a perspective view of the aluminum circuit card of the present invention, showing the apertures therein, prior to placement of the chips.

Referring to FIG. 10, aluminum circuit card 1 is shown including two apertures 21 therein which expose aluminum core layer 20. Thus it can be seen that integrated circuit devices 3, 5, 7 can be placed within aperture 21 and directly contact core layer 20 to remove the heat therefrom. Pads 11 and circuitized lines 12 are shown on the surface of circuit card 1 in FIG. 10 and may be formed by electroplating, screen printing, or the like.

For example, placing pads 11 and circuit lines 12 on the surface of EP polymer layer 25 may be accomplished using polymer thick film (PTF) screening techniques. To use this PTF method a screen is placed over the surface of card 1 and the PTF material is selectively squeeged in desired locations on card 1. After application, the PTF material is typically cured at elevated temperature. The PTF material is electrically conductive in nature and the cured PTF material is now the electrical circuit lines 12 of the aluminum circuit card 1 as shown in FIG. 10.

Figure 13:
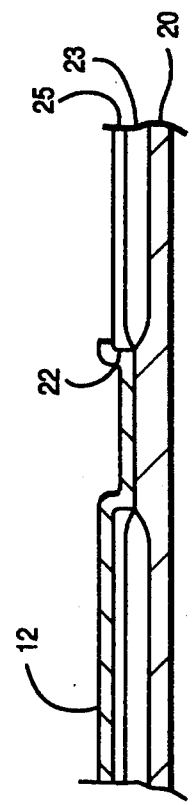
FIG. 13 is a crossectional view of an aperture being used to interconnect circuitized electrical lines with with the aluminum reference plane.

FIG. 13 is a crossection showing how an aperture 22 within anodized layer 23 and EP polymer layer 25 can be used to interconnect circuitized line 12 and aluminum reference plane 20. By utilizing the process steps of FIGS. 5-9, aperture 22 is formed. Next, during the circuitization process, previously described, the polymer thick film material can be selectively applied and cured within the aperture 22 and in contact with core 20. In this manner, an electrical connection is made between the circuitization layer (line 12) of card 1 and the reference (ground) plane 20 during the circuitization process and without the need for using any additional process steps to interconnect the circuit layer to the aluminum ground plane.

Figure 11:
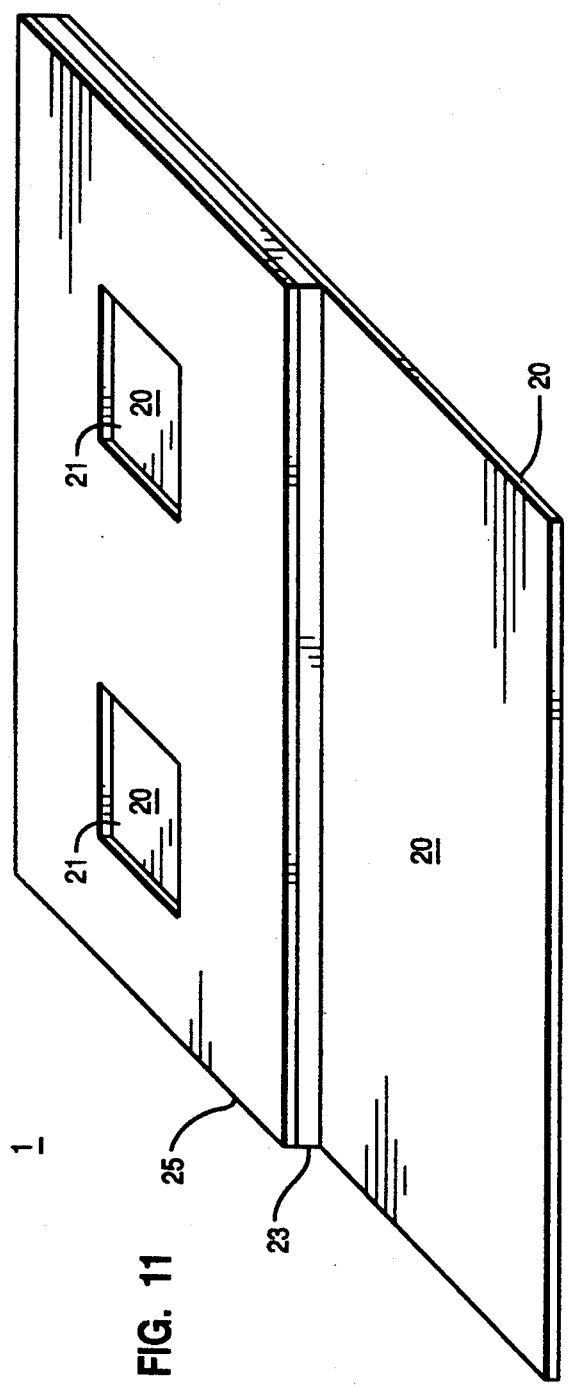
FIG. 11 is another perspective view of the circuit card wherein a portion of the aluminum layer has been protected from the anodizing and EP coating steps in accordance with the present invention.

FIG. 11 shows another embodiment of the present invention wherein a large portion of the aluminum core 20 has been protected by using a photoresist material (masked) from the anodizing and EP coating steps. In this manner, due to the increased exposure of aluminum core 20, the thermal characteristics of the aluminum circuit card are further enhanced.

Therefore, it can be seen that a method is provided for fabricating an aluminum circuit card that allows electronic components, such as integrated circuit devices resistors, capacitors, coils, or the like to be attached thereto in such a way that the dissipation of thermal energy generated by the electronic devices is enhanced. Further, the present invention allows maintaining an exposed portion of the aluminum core layer during the anodization and electrophoretic coating processes to provide a convenient connection point to the reference plane, and maintain the dimensions of alignment holes that may be placed within circuit card 1.

Although certain preferred embodiments have been shown and described, it should be understood that many changes or modifications may be made therein without departing from the scope of the appended claims.

What is claimed is:

1. An electronic circuit card, comprising:
   an aluminum core layer;
   an electrically insulating layer disposed adjacent said aluminum core layer and on at least one side thereof;
   at least one aperture formed in said electrically insulating layer to expose a corresponding portion of said aluminum core layer;
   at least one electronic component device placed in one of said apertures such that a surface of said component is in contact with said aluminum core layer and;
   at least one electrical transmission line on an exposed surface of said insulating layer extending into at least one other of said apertures.

2. A circuit card according to claim 1 wherein said electrically insulating layer comprises:
   a layer of aluminum oxide; and
   a layer of polymer.

3. A circuit card according to claim 2 wherein said exposed portion of said aluminum core layer includes an alignment hole.

4. A circuit card according to claim 3 wherein a portion of said aluminum core layer is exposed by preventing said aluminum oxide layer and said polymer layer from being formed thereon.

5. An electronic circuit card, comprising:
   an aluminum core layer;
   an electrically insulating layer disposed adjacent said aluminum core layer and on one side thereof;
   at least one aperture formed in said electrically insulating layer to expose a corresponding portion of said aluminum core layer;
   at least one electrical transmission line disposed on an exposed surface of said insulating layer and extending into at least one of said apertures such that an electrical connection is made to said core layer; and
   at least one electronic component placed in one other of said apertures such that said component is in thermal contact with said aluminum core layer.

6. A circuit card according to claim 15 wherein said electrically insulating layer comprises:
   a layer of aluminum oxide; and
   a layer of polymer.

* * * * *